United States Patent
Tang et al.

(10) Patent No.: US 10,439,635 B1
(45) Date of Patent: Oct. 8, 2019

(54) ANALOG-TO-DIGITAL CONVERSION METHOD AND ANALOG-TO-DIGITAL CONVERSION DEVICE FOR TEMPERATURE SENSOR

(71) Applicant: HANGZHOU VANGO TECHNOLOGIES, INC., Hangzhou, Zhejiang (CN)

(72) Inventors: Zhong Tang, Zhejiang (CN); Yun Fang, Zhejiang (CN); Xiaopeng Yu, Zhejiang (CN); Zheng Shi, Zhejiang (CN); Nick Nianxiong Tan, Zhejiang (CN)

(73) Assignee: HANGZHOU VANGO TECHNOLOGIES, INC., Hangzhou, Zhejiang (CN)

( * ) Notice: Subject to any disclaimer, the term of this patent is extended or adjusted under 35 U.S.C. 154(b) by 0 days.

(21) Appl. No.: 16/244,129

(22) Filed: Jan. 10, 2019

(30) Foreign Application Priority Data

Aug. 3, 2018 (CN) .......................... 2018 1 0878536

(51) Int. Cl.
*H03M 3/00* (2006.01)
*G01K 7/01* (2006.01)

(52) U.S. Cl.
CPC ............ *H03M 3/458* (2013.01); *G01K 7/015* (2013.01)

(58) Field of Classification Search
CPC ................................ H03M 3/458; G01K 7/015
USPC .................................................. 341/143, 155
See application file for complete search history.

(56) References Cited

U.S. PATENT DOCUMENTS

| | | | | |
|---|---|---|---|---|
| 6,962,436 B1* | 11/2005 | Holloway | ............... | G01K 1/028 341/143 |
| 7,126,509 B2* | 10/2006 | Sit | ........................... | H03M 1/58 341/119 |
| 8,992,080 B2* | 3/2015 | Lepidis | .................... | G01K 7/01 374/142 |
| 9,214,950 B1* | 12/2015 | Davis | ................. | H03M 1/0621 |

* cited by examiner

*Primary Examiner* — Brian K Young
(74) *Attorney, Agent, or Firm* — Yue (Robert) Xu; Apex Attorneys at Law, LLP

(57) ABSTRACT

An analog-to-digital conversion method and an A/D conversion device for a temperature sensor are provided. An analog front-end circuit generates an A/D converter input signal positively correlated to a temperature and an A/D converter reference voltage signal negatively correlated to the temperature, and an operation is performed on a ratio of amplitudes of the generated signals to obtain a quantized output value. Since the amplitude of the A/D converter input signal is less than that of the A/D converter reference voltage signal, measurements on other signals is compatible with the measurement on the temperature in a multi-sensor system. A digitized output value is calculated by a digital-assisted readout method to generate a linear output relating to a temperature, thereby improving the accuracy of temperature measurement and reducing complexity of analog circuit design.

10 Claims, 12 Drawing Sheets

ANALOG-TO-DIGITAL CONVERSION METHOD AND ANALOG-TO-DIGITAL CONVERSION DEVICE FOR TEMPERATURE SENSOR

This application claims the priority to Chinese Patent Application No. 201810878536.1, titled "ANALOG-TO-DIGITAL CONVERSION METHOD AND ANALOG-TO-DIGITAL CONVERSION DEVICE FOR TEMPERATURE SENSOR", filed on Aug. 3, 2018 with the Chinese Patent Office, which is incorporated herein by reference in its entirety.

FIELD

The present disclosure relates to the technical field of electronic circuits, and in particular to an analog-to-digital (A/D) conversion method and an A/D conversion device for a temperature sensor.

BACKGROUND

A temperature sensor may detect a temperature and convert the temperature into an available output signal. A temperature signal provided by the temperature sensor may be appropriate for different uses, and the temperature sensor is commonly used in electronic circuits. In addition to the temperature sensor, in electronic circuits and chips, it is also required to monitor and obtain other electrical information, such as battery voltages, other on-chip or off-chip direct currents, low frequency signals, which requires various types of sensors. In order to decrease a design cost, it is a common way to share a read-out interface circuit in a multi-sensor system.

However, in a conventional analog-to-digital (A/D) conversion solution, in order to share a read-out interface circuit among the temperature sensor and other types of sensors to achieve versatile of the read-out interface circuit, it is unavoidable to decrease the accuracy of conversion of the temperature signal. In order to achieve a high accuracy, it is even required to design an A/D converter specialized for the conversion of the temperature signal, which cannot be used for conversion of other types of signals, thereby increasing the design cost.

Therefore, a problem to be solved by those skilled in the art is how to provide an A/D conversion solution for a temperature sensor that combines versatile and high accuracy.

SUMMARY

An A/D conversion method and an A/D conversion device for a temperature sensor are provided according to the present disclosure, to provide an A/D conversion solution for a temperature sensor that combines versatility and high accuracy.

In order to solve the above technical problem, an A/D conversion method for a temperature sensor is provided according to the present disclosure, which includes:

generating, by an analog front-end circuit, an A/D converter input signal positively correlated to a temperature and an A/D converter reference voltage signal negatively correlated to the temperature, where an amplitude of the A/D converter input signal is less than an amplitude of the A/D converter reference voltage signal; and calculating a ratio of the amplitude of the A/D converter input signal to the amplitude of the A/D converter reference voltage signal, and performing an operation on the ratio to obtain a quantized output value.

In an embodiment, the performing an operation on the ratio to obtain a quantized output value includes:

performing an amplification operation on the ratio to obtain the quantized output value.

In an embodiment, the quantized output value is calculated from the following equation:

$$Y = \frac{n \cdot \Delta V_{BE}}{V_{BE}}$$

where Y represents the quantized output value, n represents an amplification factor, $\Delta V_{BE}$ represents the amplitude of the A/D converter input signal, and $V_{BE}$ represents the amplitude of the A/D converter reference voltage signal.

In an embodiment, after the performing an operation on the ratio to obtain a quantized output value, the method further includes:

converting the quantized output value to a target value through an operation in a digital domain, where the target value is linearly correlated to the temperature.

In an embodiment, the target value is calculated from the following equation:

$$\mu = \frac{\varphi \cdot Y}{\varphi \cdot Y + 1}$$

where μ represents the target value, φ represents a coefficient.

In an embodiment, after the converting the quantized output value to a target value through an operation in a digital domain, the method further includes:

performing a linear fitting operation on the target value based on a preset rule to obtain a temperature.

An A/D conversion device for a temperature sensor is further provided according to the present disclosure, which includes an analog front-end circuit and an A/D converter. The analog front-end circuit is configured to generate an A/D converter input signal positively correlated to a temperature and an A/D converter reference voltage signal negatively correlated to the temperature. An amplitude of the A/D converter input signal is less than an amplitude of the A/D converter reference voltage signal. The A/D converter is configured to calculate a ratio of the amplitude of the A/D converter input signal to the amplitude of the A/D converter reference voltage signal and perform an operation on the ratio to obtain a quantized output value.

In an embodiment, the A/D converter includes a ratio operation circuit. The ratio operation circuit is configured to perform an amplification operation on the ratio to obtain the quantized output value.

In an embodiment, the A/D conversion device further includes an N-Metal-Oxide-Semiconductor (NMOS) transistor starting circuit arranged in the analog front-end circuit. A gate of the NMOS transistor starting circuit is connected to an emitter of a bipolar junction transistor (BJT) of the analog front-end circuit, a source of the NMOS transistor starting circuit is connected to a gate of a cascode current mirror, and a drain of the NMOS transistor starting circuit is connected to a positive electrode of a power supply.

In an embodiment, the A/D converter is a second-order 1-bit switch capacitor A/D converter based on a Sigma-Delta modulation.

In the A/D conversion method for a temperature sensor according to the present disclosure, an analog front-end circuit generates an A/D converter input signal positively correlated to a temperature and an A/D converter reference voltage signal negatively correlated to the temperature, and an operation is performed on a ratio of the amplitude of the A/D converter input signal to the amplitude of the A/D converter reference voltage signal to obtain a quantized output value. Since the amplitude of the A/D converter input signal is less than the amplitude of the A/D converter reference voltage signal, which meets a requirement in a general application that an amplitude of an input signal is less than an amplitude of a reference signal, measurements on other types of signals is compatible with the measurement on the temperature in a multi-sensor system. In addition, the quantized output value is generated by using a voltage signal with a known temperature property, such that the influence of the temperature property of the reference voltage on the accuracy of temperature measurement result is considered, thereby improving the accuracy of temperature measurement. In summary, the A/D conversion solution for a temperature sensor according to the present disclosure combines versatile and high accuracy. An A/D conversion device for a temperature sensor is further provided according to the present disclosure, which achieves the same beneficial effect and is not repeated herein.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION

An A/D conversion method and an A/D conversion device for a temperature sensor are provided according to the present disclosure, to provide an A/D conversion solution for a temperature sensor that combines versatility and high accuracy.

The technical solutions according to the embodiments of the present disclosure are described clearly and completely in conjunction with the drawings hereinafter. It is apparent that the described embodiments are only a few rather than all of the embodiments according to the present disclosure. Any other embodiments obtained by those skilled in the art based on the embodiments of the present disclosure without any creative work fall within the protection scope of the present disclosure.

In a high-accuracy and low-cost integrated temperature sensor, an analog front-end circuit using a bipolar junction transistor BJT as a temperature sensing component is usually used in cooperation with a high-accuracy A/D converter (ADC), to read out an electrical signal generated by the BJT-based analog front-end circuit in a digital manner. There are three A/D conversion solutions for temperature sensors according to the conventional technology.

Figure 1:
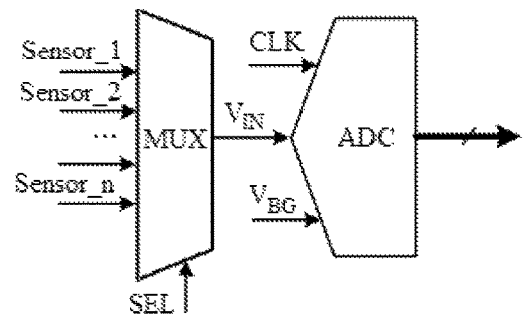
FIG. 1 is a schematic diagram of a first A/D conversion device for a temperature sensor according to the conventional technology.

FIG. 1 is a schematic diagram of a first A/D conversion device for a temperature sensor according to the conventional technology. As shown in FIG. 1, in a conventional multi-sensor system, a reference voltage $V_{BG}$ usually serves as a reference voltage of an A/D converter, and a multiplexer selects required input signals (Sensor_1, Sensor_2, ..., Sensor_n), then the input signals are inputted to the A/D converter to obtain an quantized output value. The output of the BJT-based analog front-end circuit is also used as one of the required input signals. The quantized output value is calculated from the following equation:

$$\mu = \frac{V_{IN}}{V_{BG}} \tag{1}$$

where $V_{IN}$ represents a voltage converted from a temperature by the temperature sensor. The temperature is obtained by a table-searching method or an equation conversion method based on a ratio of the voltage to the reference voltage $V_{BG}$.

In addition, in a conventional single high-accuracy CMOS temperature sensor, the analog front-end circuit itself may generate a voltage $\Delta V_{BE}$ positively correlated to the temperature and the voltage $V_{BE}$ negatively correlated to the temperature, and a reference voltage is usually generated indirectly. At present, there are two solutions according to the conventional technology.

Figure 2:
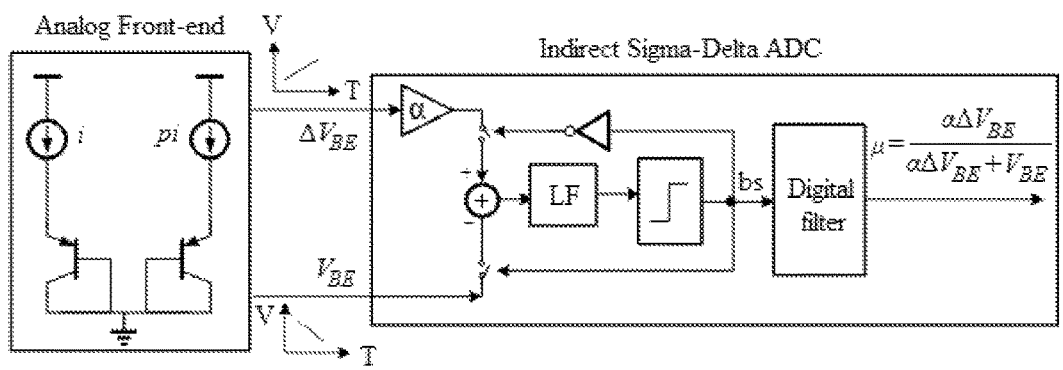
FIG. 2 is a schematic diagram of a second A/D conversion device for a temperature sensor according to the conventional technology.

FIG. 2 is a schematic diagram of a second A/D conversion device for a temperature sensor according to the conventional technology. As shown in FIG. 2, in addition to the analog front-end circuit, an indirect Sigma-Delta modulation based A/D converter (Indirect Sigma-Delta ADC) is also used. In the Sigma-Delta ADC, $\Delta V_{BE}$ and $V_{BE}$ are dynamically determined based on a feedback, thereby indirectly generating the reference voltage $\alpha \cdot \Delta V_{BE} + V_{BE}$ that is almost independent of the temperature. The quantized output value is calculated from the following equation:

$$\mu = \frac{\alpha \Delta V_{BE}}{\alpha \Delta V_{BE} + V_{BE}} \quad (2)$$

where $\alpha$ represents a coefficient.

Figure 3:
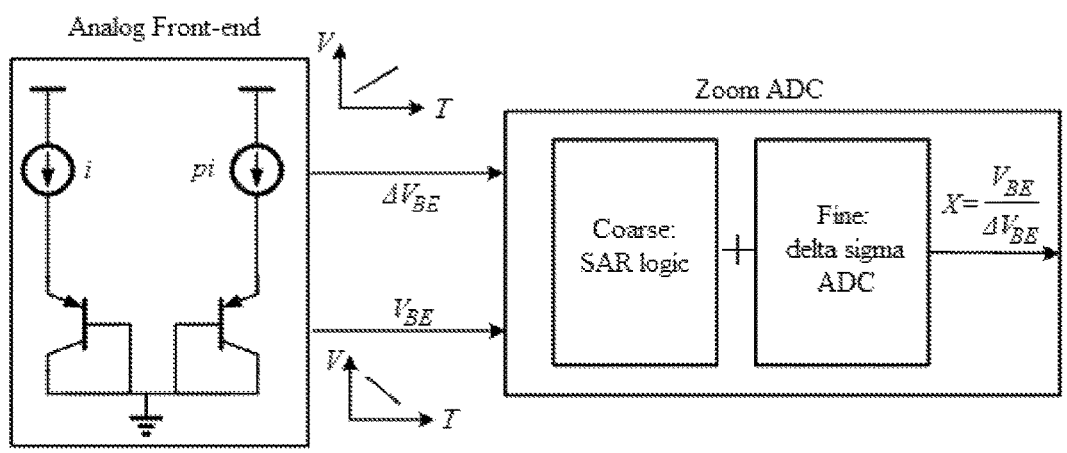
FIG. 3 is a schematic diagram of a third A/D conversion device for a temperature sensor according to the conventional technology.

FIG. 3 is a schematic diagram of a third A/D conversion device for a temperature sensor according to the conventional technology. As shown in FIG. 3, in addition to the analog front-end circuit, a zoom A/D converter (Zoom ADC) combining a successive approximation register A/D converter (SAR ADC) and a delta-sigma A/D converter is constructed based on a relationship between input signals $V_{BE}$ and $\Delta V_{BE}$ to a temperature sensor. A quantized output is obtained which is expressed by $X = V_{BE}/\Delta V_{BE}$. The quantized output $X = V_{BE}/\Delta V_{BE}$ is substituted into the equation (2) through an operation in a digital domain to obtain the following equation:

$$\mu = \frac{\alpha}{\alpha + X} \quad (3)$$

The first A/D conversion solution is the most commonly used for multi-sensor systems, in which a universal reference voltage independent of an analog front-end circuit of a temperature sensor is used as the reference voltage. However, since an absolute value of the reference voltage and a temperature property of the reference voltage may directly affect an accuracy of a temperature measurement result, temperature measurement result is not only related to the accuracy of the analog front-end circuit of the temperature sensor, but also related to the voltage property of the reference voltage, thereby resulting in a limited accuracy of temperature measurement.

With the second A/D conversion solution and the third A/D conversion solution, which are read-out solutions designed specifically for temperature sensors, the disadvantages of the first A/D conversion solution can be overcome and a high accuracy can be achieved.

In a case that the second A/D conversion solution is applied to the multi-sensor system, $\Delta V_{BE}$ is used as an input signal, $V_{BE}$ is used as a reference signal, an indirect A/D converter is configured to generate a reference voltage $\alpha \cdot \Delta V_{BE} + V_{BE}$ and generate a quantized output according to the equation (2). However, in this solution, measurements on other signals are not compatible with a measurement on the temperature in the multi-sensor system. For example, in a case the second A/D conversion solution is applied to measure other signals, $V_{IN}$ is used as the input signal, $V_{BG}$ is used as the reference signal, however, the equation (1) is not derived for the quantized output with the second A/D conversion solution.

The third A/D conversion solution is similar to the second A/D conversion solution, except that the third A/D conversion solution is implemented more easily in hardware. However, since the quantized output $$\frac{V_{BE}}{\Delta V_{BE}}$$

is obtained by the zoom ADC, and the input signal $V_{BE}$ is far greater than the reference signal $\Delta V_{BE}$, the third A/D conversion solution cannot meet a requirement in a general application that an amplitude of the input signal is less than an amplitude of the reference signal. Therefore, the measurements on other signals are not compatible with a measurement on the temperature in the multi-sensor system.

Figure 4:
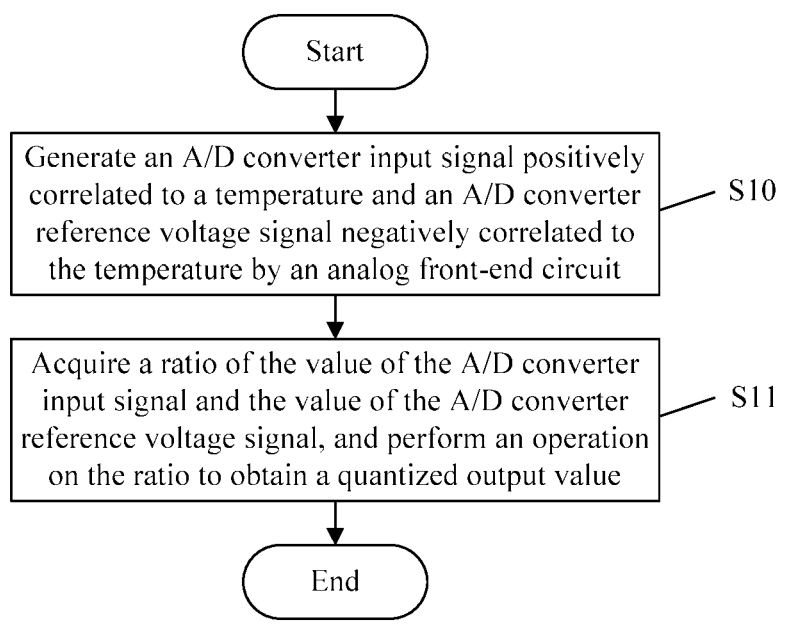
FIG. 4 is a flow chart of a first A/D conversion method for a temperature sensor according to an embodiment of the present disclosure.

FIG. 4 is a flow chart of a first A/D conversion method for a temperature sensor according to an embodiment of the present disclosure. As shown in FIG. 4, an A/D conversion method for a temperature sensor includes the following steps S10 to S11.

In step S10, an analog front-end circuit generates an A/D converter input signal positively correlated to a temperature and an A/D converter reference voltage signal negatively correlated to the temperature.

An amplitude of the A/D converter input signal is less than an amplitude of the A/D converter reference voltage signal.

In a conventional independent high-accuracy CMOS temperature sensor, the analog front-end circuit may generate the A/D converter input signal $\Delta V_{BE}$ positively correlated to the temperature and the A/D converter reference voltage signal $V_{BE}$ negatively correlated to the temperature, and the amplitude of the A/D converter input signal $\Delta V_{BE}$ is less than the amplitude of the A/D converter reference voltage signal $V_{BE}$. In a specific implementation, the BJT-based analog front-end circuit generates the A/D converter input signal $\Delta V_{BE}$ positively correlated to the temperature and the A/D converter reference voltage signal $V_{BE}$ negatively correlated to the temperature.

In step S11, a ratio of the amplitude of the A/D converter input signal to the amplitude of the A/D converter reference voltage signal is calculated, and an operation is performed on the ratio to obtain a quantized output value.

A ratio $\Delta V_{BE}/V_{BE}$ of the amplitude of the A/D converter input signal $\Delta V_{BE}$ to the amplitude of the A/D converter reference voltage signal $V_{BE}$ is calculated. The ratio is greater than zero and less than one.

In an embodiment, an amplification operation may be performed on the ratio to obtain the quantized output value, to make full use of a dynamic range of the A/D converter. The quantized output value may be calculated from the following equation:

$$Y = \frac{n \cdot \Delta V_{BE}}{V_{BE}} \quad (4)$$

where Y represents the quantized output value, n represents an amplification factor, $\Delta V_{BE}$ represents the amplitude of the A/D converter input signal, $V_{BE}$ represents the amplitude of the A/D converter reference voltage signal. The quantized output value follows a nonlinear curve monotonically varying with the temperature.

n may be determined based on an actual process and a required temperature range, thus making full use of the dynamic range of the A/D converter.

In the A/D conversion method for a temperature sensor according to the present disclosure, the analog front-end circuit generates an A/D converter input signal positively correlated to a temperature and an A/D converter reference voltage signal negatively correlated to the temperature and an operation is performed on a ratio of the amplitude of the A/D converter input signal to the amplitude of the A/D converter reference voltage signal to obtain a quantized output value. The quantized output value is converted to a digital signal and then the digital signal is outputted. Since the amplitude of the A/D converter input signal is less than the amplitude of the A/D converter reference voltage signal, which meets a requirement in a general application that an amplitude of an input signal is less than an amplitude of a reference signal, measurements on other types of signals is compatible with a measurement on a temperature in a multi-sensor system. In addition, the quantized output value is generated by using a voltage signal with a known temperature property, such that the influence of the temperature property of the reference voltage on the accuracy of the temperature measurement result is considered, thereby improving the accuracy of temperature measurement. In summary, the A/D conversion solution for a temperature sensor according to the present disclosure combines versatile and high accuracy.

Figure 5:
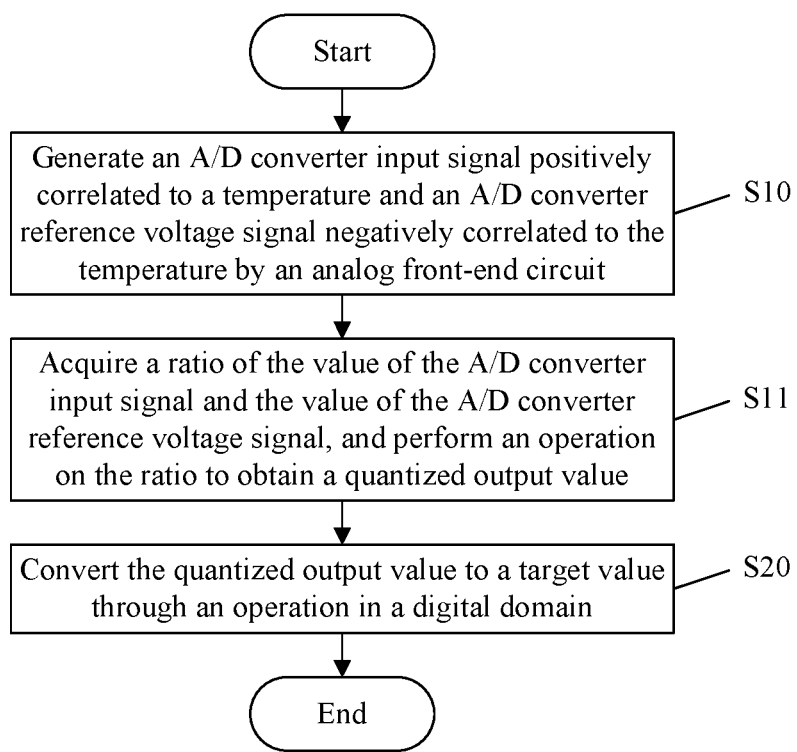
FIG. 5 is a flow chart of a second A/D conversion method for a temperature sensor according to an embodiment of the present disclosure.

FIG. 5 is a flow chart of a second A/D conversion method for a temperature sensor according to an embodiment of the present disclosure. As shown in FIG. 5, based on the above embodiment, in another embodiment, after step S11, the A/D conversion method for a temperature sensor further includes step S20.

In step S20, the quantized output value is converted to a target value through an operation in a digital domain. The target value is linearly correlated to the temperature.

In a specific embodiment, the quantized output value is converted to a target value through an operation in a digital domain according to the following equation:

$$\mu = \frac{\varphi \cdot Y}{\varphi \cdot Y + 1} \tag{5}$$

where $\mu$ represents the target value obtained by conversion, $\varphi$ represents a coefficient.

The operation process of deriving the equation (5) by substituting the equation (4) into the equation (2) may include:
substituting the equation $$Y = \frac{n \cdot \Delta V_{BE}}{V_{BE}}$$

into the equation $$\mu = \frac{\alpha \Delta V_{BE}}{\alpha \Delta V_{BE} + V_{BE}}$$

to obtain an intermediate equation; and
assuming that $$\varphi = \frac{\alpha}{n}$$

and simplifying the intermediate equation to obtain the equation (5)

$$\mu = \frac{\varphi \cdot Y}{\varphi \cdot Y + 1}.$$

In the A/D converter, the equation (5) may be derived simply and the quantized output value is converted to the target value through a simple operation in the digital domain, such that complexity of an analog read-out circuit is greatly reduced. In addition, the linearity of $\mu$ may be adjusted in the digital domain by adjusting the coefficient $\varphi$, such that overall non-linearity, the fitting error and the requirement on an absolute value of n in the circuit design are reduced.

Figure 6:
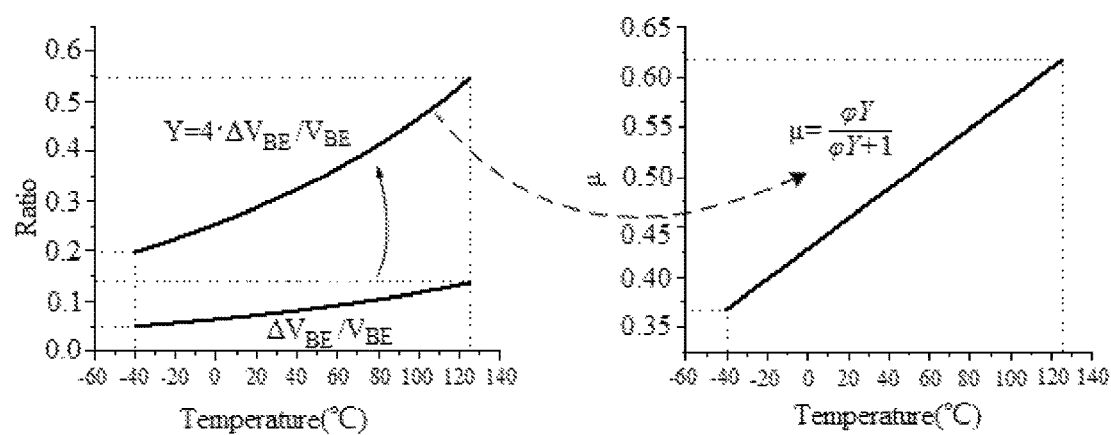
FIG. 6 is a schematic diagram of a read-out solution according to an embodiment of the present disclosure.

FIG. 6 is a schematic diagram of a read-out solution according to an embodiment of the present disclosure. As shown in FIG. 6, the ratio $\Delta V_{BE}/V_{BE}$ is amplified by 4 times to obtain an output Y, such that the dynamic range is increased from being less than 9% to being about 35%. The output Y follows a non-linear curve varying monotonically with the temperature. By introducing the coefficient $\varphi$ to obtain the equation (5), the output Y, which follows a curve non-linearly correlated to the temperature, is converted into $\mu$ linearly correlated to the temperature.

Figure 7:
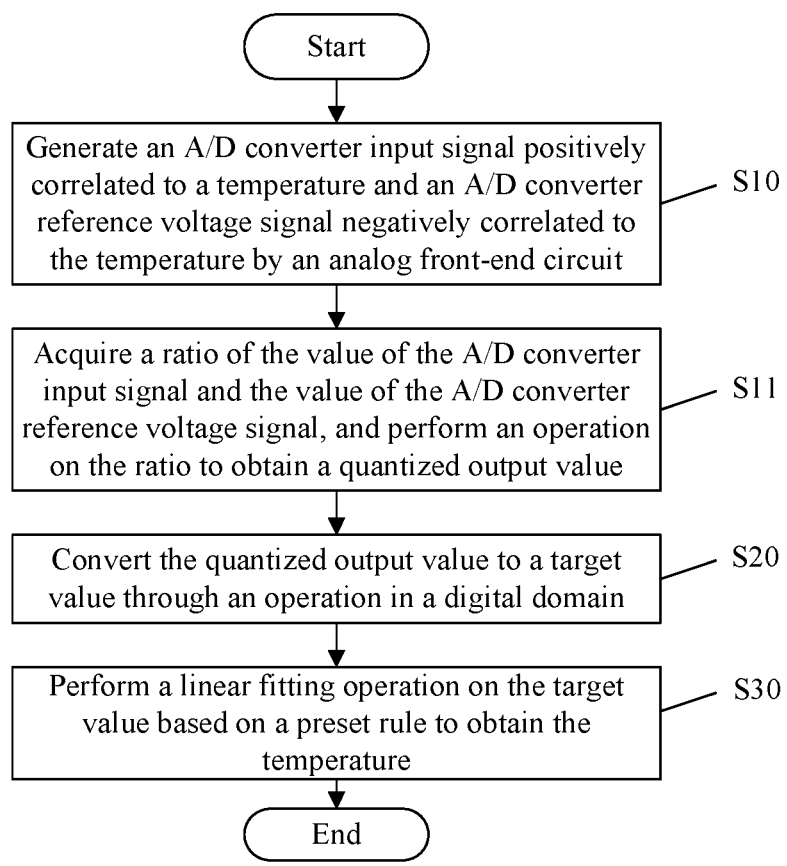
FIG. 7 is a flow chart of an A/D conversion method for a temperature sensor according to another embodiment of the present disclosure.

FIG. 7 is a flow chart of an A/D conversion method for a temperature sensor according to another embodiment of the present disclosure. As shown in FIG. 7, based on the above embodiments, in another embodiment, after step S20, the A/D conversion method for a temperature sensor further includes step S30.

In step S30, a linear fitting operation is performed on the target value based on a preset rule to obtain a temperature.

The linearized equation (5) is derived through an operation in the digital domain, and the temperature is finally obtained through a simple linear fitting operation according to the following equation:

$$T = A^*\mu + B \tag{6}$$

where T represents the finally obtained temperature, A and B represent coefficients which may be determined according to an actual design of a circuit.

In a specific embodiment, it is required to perform correction for the obtained temperature. For chips produced in the same batch, all the chips may be corrected using the same linear fitting coefficients A and B under a same temperature. That is, a digital coefficient co is corrected under a certain temperature (such as a room temperature), to minimize an error under the temperature.

Embodiments corresponding to the A/D conversion method for a temperature sensor are described in detail above, an A/D conversion device for a temperature sensor corresponding to the above method is further provided according to the present disclosure.

Figure 8:
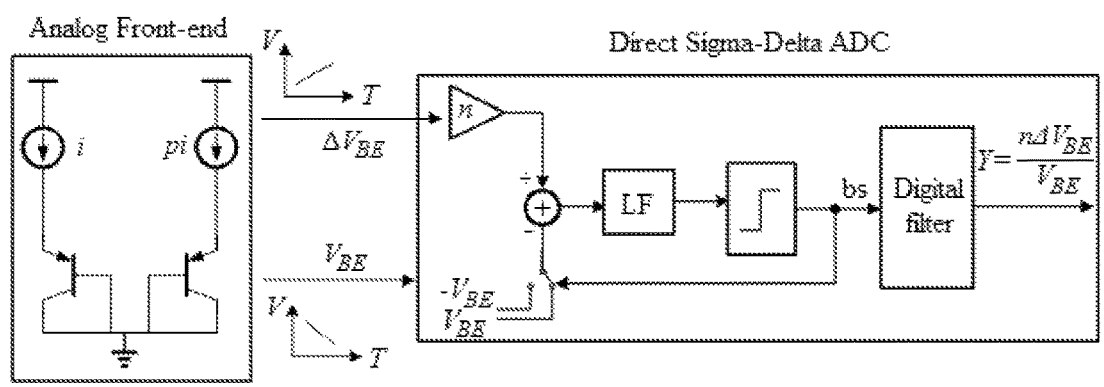
FIG. 8 is a schematic structural diagram of an A/D conversion device for a temperature sensor according to an embodiment of the present disclosure.

FIG. 8 is a schematic structural diagram of an A/D conversion device for a temperature sensor according to an embodiment of the present disclosure. As shown in FIG. 8, the A/D conversion device for a temperature sensor includes an analog front-end circuit and a direct sigma-delta A/D converter. The analog front-end circuit is configured to generate an A/D converter input signal positively correlated to a temperature and an A/D converter reference voltage signal negatively correlated to the temperature. An amplitude of the A/D converter input signal is less than an amplitude of the A/D converter reference voltage signal. The direct sigma-delta A/D converter is configured to acquire a ratio of the amplitude of the A/D converter input signal to the amplitude of the A/D converter reference voltage signal and perform an operation on the ratio to obtain a quantized output value.

Furthermore, the A/D converter includes a ratio operation circuit configured to perform an amplification operation on the ratio to obtain the quantized output value.

Based on the above embodiments, a circuit for implementing the above A/D conversion method is provided according to the present disclosure.

Figure 9:
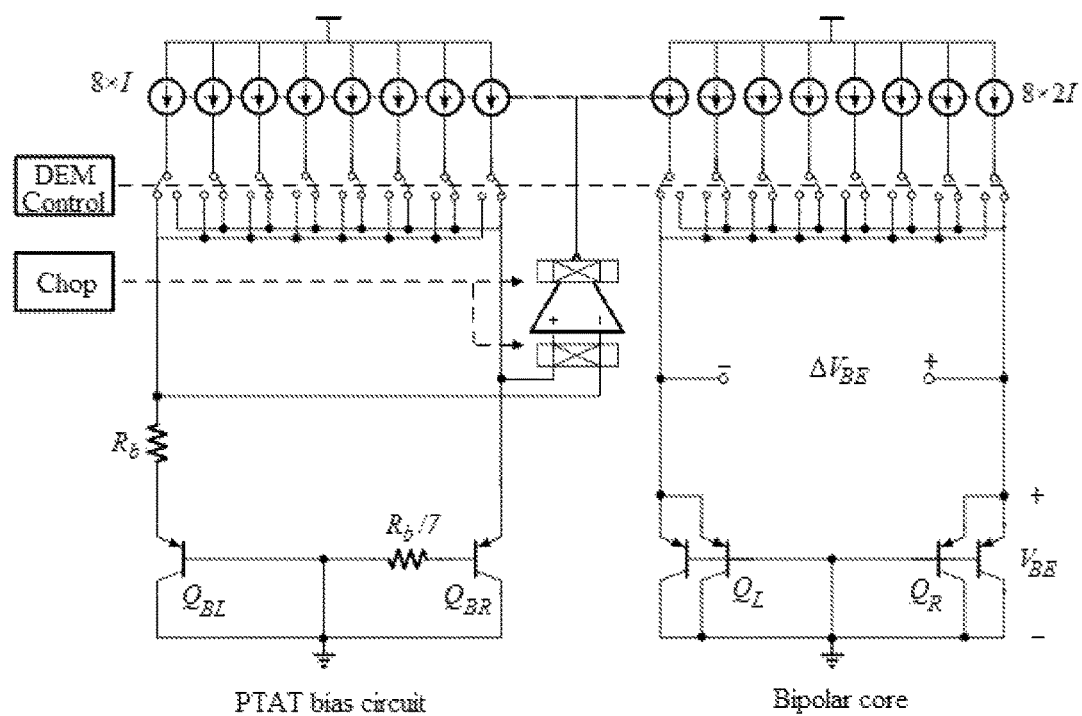
FIG. 9 is a schematic diagram of a bipolar junction transistor (BJT)-based front-end circuit according to an embodiment of the present disclosure.

FIG. 9 is a schematic diagram of a BJT-based front-end circuit according to an embodiment of the present disclosure.

As shown in FIG. 9, the analog front-end circuit includes two parts, that is, a proportional-to-absolute temperature bias current generation circuit (PTAT bias circuit) and a core module (Bipolar core) for generating $V_{BE}$ and $\Delta V_{BE}$. A base of a BJT of the PTAT bias circuit is connected to a resistor ($R_b/7$ shown in FIG. 9), to achieve compensation of limited current gain. In a specific circuit, dynamic element matching (DEM Control) is performed on a transistor of a current mirror, and Chop Stabilization is performed on an operational amplifier, to improve the accuracy of the circuit.

Figure 10:
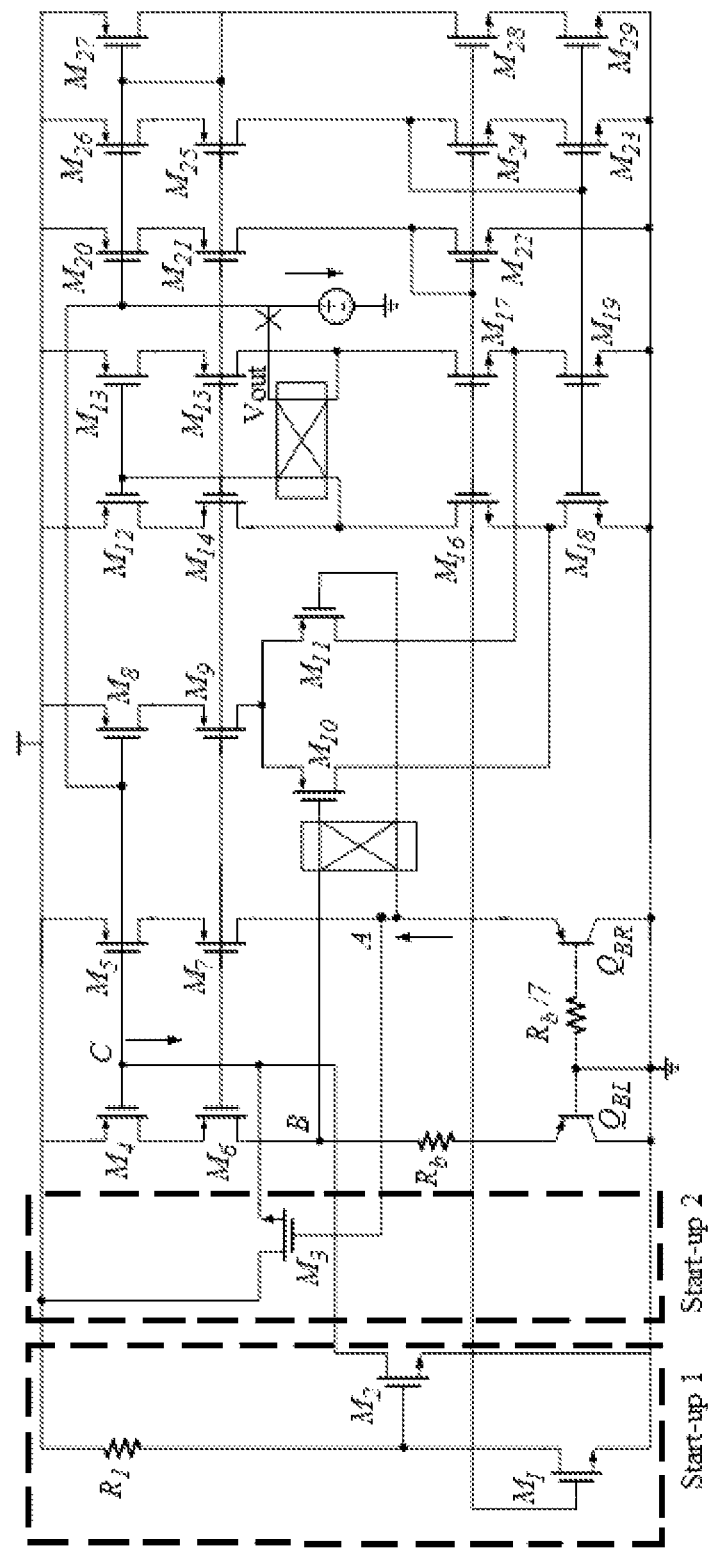
FIG. 10 is a schematic diagram of a proportional-to-absolute temperature (PTAT) bias current generation circuit according to an embodiment of the present disclosure.
Figure 11:
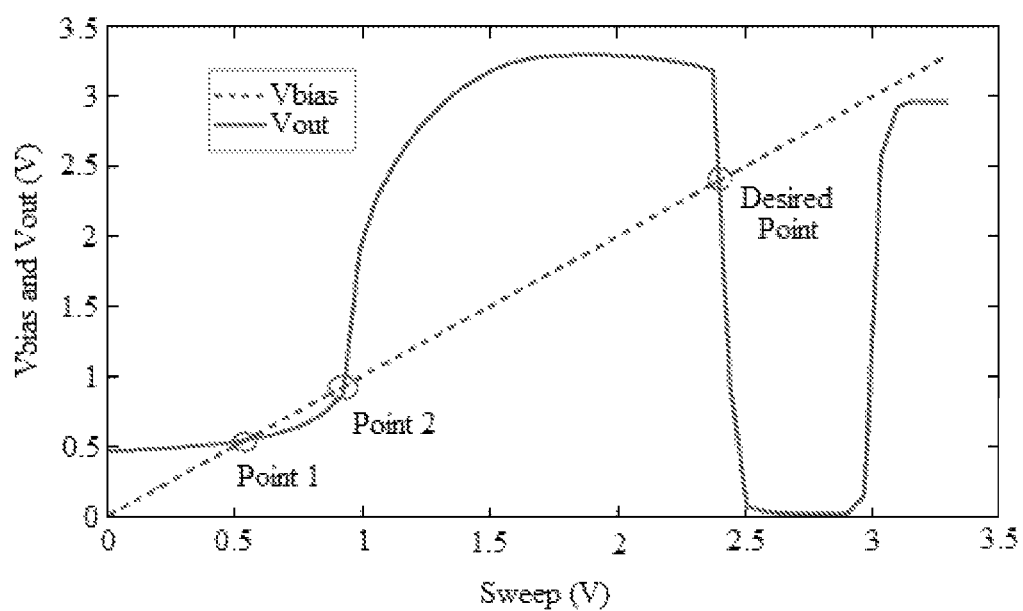
FIG. 11 is a graph of a simulation voltage at an output terminal of a direct current simulation operational amplifier without a starting circuit.

FIG. 10 is a schematic diagram of a PTAT bias current generation circuit according to an embodiment of the present disclosure. FIG. 11 is a graph of a simulation voltage at an output terminal of a direct current simulation operational amplifier without a starting circuit.

The PTAT bias current generation circuit and the operational amplifier may be as shown in FIG. 10 in an unrolled manner. A self-biased folded-cascode operational amplifier is used to reduce power consumption and design complexity.

In the PTAT bias current generation circuit, since a compensation resistor $R_b/7$ is connected to a base of the BJT in series, the PTAT bias current generation circuit operates in a way different from that of a conventional PTAT bias current generation circuit, in which a main difference lies in additional operation degeneration points. If a voltage supply is connected to a terminal C to supply a sweeping voltage from 0 to $V_{dd}$, a waveform of a voltage $V_{out}$ at an output terminal of the operational amplifier is as shown in FIG. 11. An intersection point of the waveform of the voltage $V_{out}$ and a curve of a voltage Vbias for voltage sweeping is a possible operation degeneration point. As can be seen from FIG. 11, there are at least three degeneration points, namely Point1, Point2 and Desired Point, and only the Desired Point is desired. It is required to prevent the PTAT bias current generation circuit from operating at the other two degeneration points.

Therefore, it is required to design an additional starting circuit to ensure a stable operation of the circuit. As shown in FIG. 10, an A/D conversion device for a temperature sensor may further include an N-Metal-Oxide-Semiconductor (NMOS) transistor starting circuit (which is shown as a part where the NMOS transistor $M_3$ is located in FIG. 10). The NMOS transistor starting circuit is provided in the PTAT bias current generation circuit of the analog front-end circuit, a gate of the NMOS transistor starting circuit is connected to an emitter of the BJT of the analog front-end circuit, a source of the NMOS transistor starting circuit is connected to a gate terminal of the cascode current mirror, and a drain of the NMOS transistor starting circuit is connected to a positive electrode of a power supply.

As shown in FIG. 11, after the starting circuit is provided, in a case that the circuit operates at a wrong degeneration point, the voltage $V_{out}$ at point C is about 1V, and the current is high, the transistors of the current mirror are all operated in a linear region. A potential at point A is raised due to voltage drop of the resistor $R_b/7$ at the base, to cause the NMOS transistor $M_3$ to operate under a condition $V_{gs} > V_{th}$. In this way, the NMOS transistor $M_3$ is conducted, such that the potential at the point C is raised, thereby preventing the circuit from being operated at the wrong degeneration point.

Figure 12:
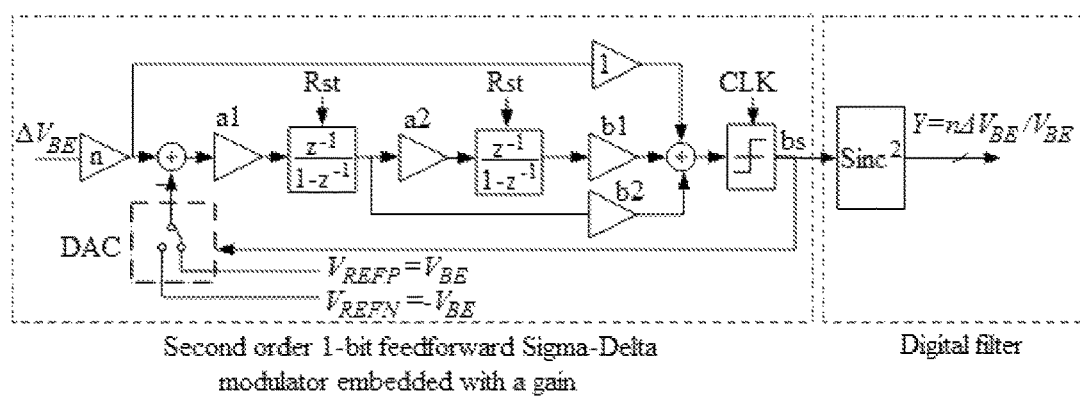
FIG. 12 is a system block diagram of an A/D converter according to an embodiment of the present disclosure.
Figure 13:
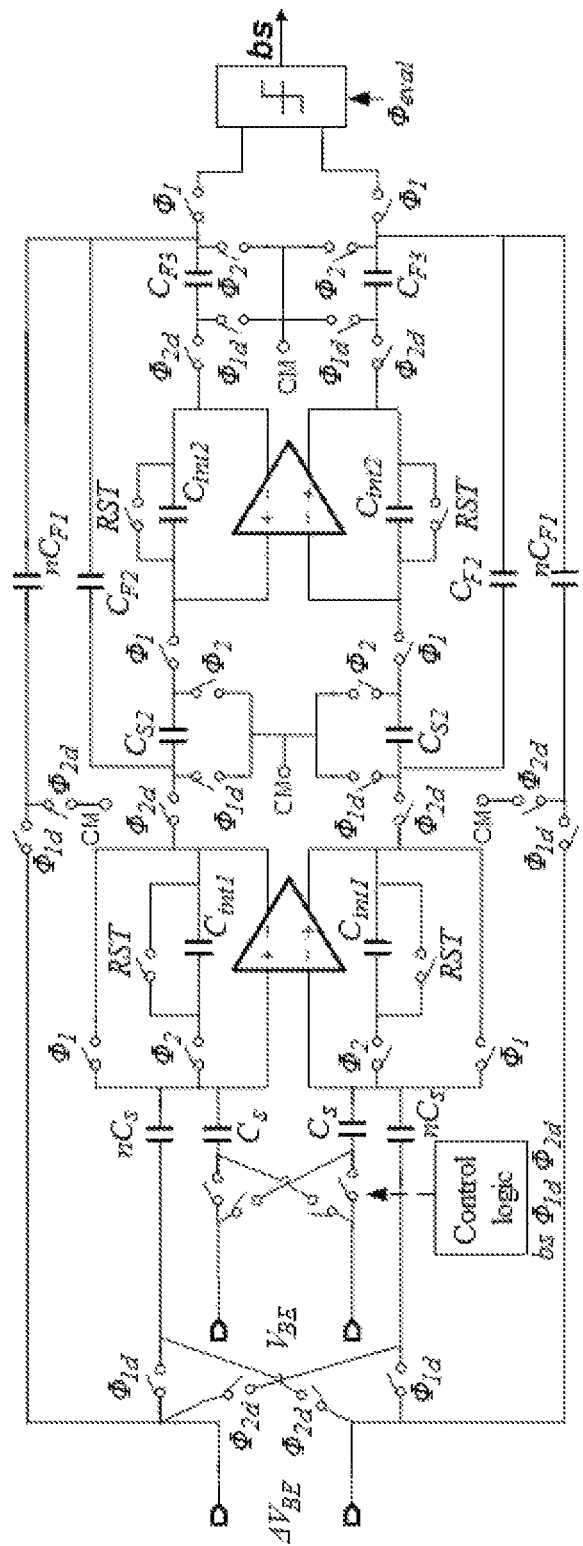
FIG. 13 shows an A/D conversion circuit corresponding to the system block diagram shown in FIG. 12 according to an embodiment of the present disclosure.

FIG. 12 is a system block diagram of an A/D converter according to an embodiment of the present disclosure. FIG. 13 shows an A/D conversion circuit corresponding to the system block diagram shown in FIG. 12 according to an embodiment of the present disclosure.

The A/D converter may be a universal A/D converter, specifically a second-order 1-bit switch capacitor A/D converter based on the sigma-delta modulation. As shown in FIG. 12, the A/D converter includes a digital filter and a second order 1-bit feedforward Sigma-Delta modulator embedded with a gain. A transfer function for the A/D converter in the block diagram is expressed by:

$$V(z) = n \cdot U(z) + \frac{(1-z^{-1})^2}{D(z)} E(z) \tag{7}$$

where V(z) represents an output of the second order 1-bit feedforward Sigma-Delta modulator embedded with a gain, n represents a signal amplification factor, U(z) represents an input signal, E(z) represents a quantized error, D(z) represents a polynomial including $a_1$, $b_1$, $b_2$.

A function Sin $c^2$ for the digital filter is expressed by:

$$H(z) = \frac{1}{D^2}\left(\frac{1-z^{-D}}{1-z^{-1}}\right)^2 \tag{8}$$

where D represents a down-sampling rate.

The A/D conversion circuit corresponding to the system block diagram in FIG. 12 is as shown in FIG. 13, and detailed description thereof may be referred to that of FIG. 12, which is not described herein. It is to be noted that the gain n embedded in the A/D converter may be adjusted based on specific application scenarios to meet requirements of different input signals.

As shown in FIG. 13, a case of n=4 is taken as an example. Four sampling capacitors provide a charge proportional to $2 \cdot \Delta V_{BE}$ over a complete clock cycle, which is expressed by:

$$Q_{\Delta V_{BE}} = 4C_S(2 \cdot \Delta V_{BE}) \tag{9}$$

where $C_S$ represents a unit sampling capacitance at a first stage, which is equal to 900 fF. Cs may be determined based on a kT/C noise and a process matching condition. Only one sampling capacitor provides a charge proportional to a feedback voltage $2 \cdot V_{dac}$, which is expressed by:

$$Q_{V_{dac}} = C_S(2 \cdot V_{dac}) \tag{10}$$

where $V_{dac}$ may be equal to $V_{BE}$ or $\Delta V_{BE}$ based on an output bit stream. Due to feedback in the second-order 1-bit feedforward Sigma-Delta modulator embedded with a gain, an average value of charges transmitted to an integrating capacitor is zero, which is expressed by:

$$Y \cdot 2 \cdot C_S(4 \cdot \Delta V_{BE} - V_{BE}) + (1-Y) \cdot 2 \cdot C_S(4 \cdot \Delta V_{BE} + V_{BE}) = 0 \tag{11}$$

the following equation may be obtained by solving the equation (11):

$$Y = \frac{4 \cdot \Delta V_{BE}}{V_{BE}}.$$

In the embodiments mentioned in the disclosure, it is to be understood that, the disclosed device and method may be implemented in other ways. For example, the above device embodiment is only illustrative. For example, the division of the modules is only a logical functional division. In practice, there may be other divisions. For example, multiple modules or assembles may be combined or may be integrated into another system. Alternatively, some features may be neglected or not be performed. The displayed or discussed mutual coupling or direct coupling or communication connection may be an indirect coupling or communication connection via some interfaces, devices or modules, which may be in an electrical, mechanical or other form. The module described as a separate component may be or may not be separate physically, and the component which is displayed as a module may be or may not be a physical module, that is, may be located at a position, or may be distributed over multiple network modules. Some or all of the modules may be selected as required to implement the solution of the embodiment.

Further, the functional modules in the embodiments of the disclosure may be integrated into one processing module, and may exist physically separately, and may be integrated into one module by two or more. The above integrated module may be implemented in hardware, and may also be implemented by using a software functional module.

The A/D conversion method and the A/D conversion device for a temperature sensor according to the present disclosure are described in detail. The embodiments of the present disclosure are described in a progressive manner, and each embodiment places emphasis on the difference from other embodiments. Therefore, for the same or similar parts between the embodiments, one may refer to the description of other embodiments. For the device and system according to the embodiments, the device corresponds to the method according to the embodiments. Therefore, the description thereof is simple, and for the related parts, one may refer to the description of the method embodiments. It should be noted that various deformations and modifications may be made to the present disclosure by those skilled in the art without departing from the spirit and scope of the present disclosure, and these deformations and modifications all fall within the scope of the present disclosure.

It should also be illustrated that a relationship term such as "the first" and "the second" herein is only used to distinguish one entity or operation from another entity or operation, and does not necessarily require or imply that there is an actual relationship or sequence between these entities or operations. Furthermore, terms "include", "comprise" or any other variations are intended to be non-exclusive, so that a process, a method, an object or a device including a series of factors not only include the factors, but also include other factors not explicitly listed, or also include factors inherent for the process, the method, the object or the device. Without more limitation, a factor defined by a sentence "include one . . . " does not exclude a case that there is also another same factor in the process, the method, the object or the device including the described factors.

The invention claimed is:

1. An analog-to-digital (A/D) conversion method for a temperature sensor, comprising:
generating, by an analog front-end circuit, an A/D converter input signal positively correlated to a temperature and an A/D converter reference voltage signal negatively correlated to the temperature, wherein an amplitude of the A/D converter input signal is less than an amplitude of the A/D converter reference voltage signal; and
calculating a ratio of the amplitude of the A/D converter input signal to the amplitude of the A/D converter reference voltage signal, and performing an operation on the ratio to obtain a quantized output value.

2. The A/D conversion method according to claim 1, wherein the performing an operation on the ratio to obtain a quantized output value comprises:
performing an amplification operation on the ratio to obtain the quantized output value.

3. The A/D conversion method according to claim 2, wherein the quantized output value is calculated from the following equation:

$$Y = \frac{n \cdot \Delta V_{BE}}{V_{BE}}$$

where Y represents the quantized output value, n represents an amplification factor, $\Delta V_{BE}$ represents the amplitude of the A/D converter input signal, and $V_{BE}$ represents the amplitude of the A/D converter reference voltage signal.

4. The A/D conversion method according to claim 3, wherein after the performing an operation on the ratio to obtain a quantized output value, the method further comprises:
converting the quantized output value to a target value through an operation in a digital domain, and wherein the target value is linearly correlated to the temperature.

5. The A/D conversion method according to claim 4, wherein the target value is calculated from the following equation:

$$\mu = \frac{\varphi \cdot Y}{\varphi \cdot Y + 1}$$

where $\mu$ represents the target value, $\varphi$ represents a coefficient.

6. The A/D conversion method according to claim 4, wherein after the converting the quantized output value to a target value through an operation in a digital domain, the method further comprises:
performing a linear fitting operation on the target value based on a preset rule to obtain the temperature.

7. An analog-to-digital (A/D) conversion device for a temperature sensor, comprising:
an analog front-end circuit configured to generate an A/D converter input signal positively correlated to a temperature and an A/D converter reference voltage signal negatively correlated to the temperature, wherein an amplitude of the A/D converter input signal is less than an amplitude of the A/D converter reference voltage signal; and
an A/D converter configured to calculate a ratio of the amplitude of the A/D converter input signal to the amplitude of the A/D converter reference voltage signal and perform an operation on the ratio to obtain a quantized output value.

8. The A/D conversion device according to claim 7, wherein the A/D converter comprises:
a ratio operation circuit configured to perform an amplification operation on the ratio to obtain the quantized output value.

9. The A/D conversion device according to claim 7, further comprising an N-Metal-Oxide-Semiconductor (NMOS) transistor starting circuit arranged in the analog front-end circuit, wherein a gate of the NMOS transistor starting circuit is connected to an emitter of a bipolar junction transistor (BJT) of the analog front-end circuit, a source of the NMOS transistor starting circuit is connected to a gate of a cascode current mirror, and a drain of the NMOS transistor starting circuit is connected to a positive electrode of a power supply.

10. The A/D conversion device according to claim 7, wherein the A/D converter is a second-order 1-bit switch capacitor A/D converter based on a Sigma-Delta modulation.

\* \* \* \* \*